US008179121B2

(12) United States Patent  
Hynd et al.

(10) Patent No.: US 8,179,121 B2  
(45) Date of Patent: May 15, 2012

(54) BRIDGE SENSOR WITH COLLOCATED ELECTRONICS AND TWO-WIRE INTERFACE

(75) Inventors: John William Hynd, Clarence Center, NY (US); Robert D. Sill, Laguna Hills, CA (US); James R. Higbee, East Aurora, NY (US)

(73) Assignee: PCB Piezotronics, Inc., Depew, NY (US)

( * ) Notice: Subject to any disclaimer, the term of this patent is extended or adjusted under 35 U.S.C. 154(b) by 510 days.

(21) Appl. No.: 12/413,995

(22) Filed: Mar. 30, 2009

(65) Prior Publication Data

US 2010/0244813 A1 Sep. 30, 2010

(51) Int. Cl.
*G01R 1/30* (2006.01)
(52) U.S. Cl. .................................. 324/123 R; 324/610
(58) Field of Classification Search .............. 324/123 R, 324/443, 207.19, 526, 610, 648, 651, 657, 324/666, 673, 680, 706, 101, 721, 725, 679; 73/708, 702

See application file for complete search history.

(56) References Cited

U.S. PATENT DOCUMENTS

| 2,904,681 | A | | 9/1959 | Jones, Jr. et al. | |
|---|---|---|---|---|---|
| 4,071,823 | A | * | 1/1978 | Okayama | 324/123 R |
| 4,362,060 | A | * | 12/1982 | Okayama et al. | 73/708 |
| 5,526,425 | A | | 6/1996 | Meyer et al. | |
| 6,198,296 | B1 | | 3/2001 | Ivanov | |
| 6,712,772 | B2 | | 3/2004 | Cohen et al. | |
| 7,155,980 | B2 | | 1/2007 | Kurtz | |
| 7,427,797 | B2 | | 9/2008 | Ohguro et al. | |
| 2001/0035758 | A1 | | 11/2001 | Furukawa | |
| 2004/0152999 | A1 | | 8/2004 | Cohen et al. | |
| 2008/0079444 | A1 | | 4/2008 | Denison | |

FOREIGN PATENT DOCUMENTS

| GB | 801130 | 9/1958 |
|---|---|---|
| JP | 05203518 A | 8/1993 |
| JP | 09-044784 A | 2/1997 |
| JP | 10090301 A | 4/1998 |
| JP | 2001500625 A | 1/2001 |

OTHER PUBLICATIONS

ISA/KR, International Search Report for PCT/US2010/027901, Oct. 14, 2010.
ISA/KR, Written Opinion of the International Searching Authority for PCT/US2010/027901, Oct. 14, 2010.

* cited by examiner

*Primary Examiner* — Huy Q Phan
*Assistant Examiner* — Alesa Allgood
(74) *Attorney, Agent, or Firm* — Phillips Lytle LLP

(57) ABSTRACT

A transducer, including: a housing; a bridge sensor circuit disposed within the housing and including at least one micro electro-mechanical systems (MEMS) sensing elements and first and second output ports; circuitry disposed within the housing; and an input/output (I/O) line electrically connected to the circuitry, accessible at an exterior of the housing, and adapted for receipt of input voltage or current. The circuitry is for generating a single data signal that combines respective outputs of the first and second output ports, and transmitting the DC-coupled single data signal on the I/O line. The circuitry is for generating and transmitting to the bridge sensor circuit an excitation current or voltage using the input voltage or current.

10 Claims, 8 Drawing Sheets

BRIDGE SENSOR WITH COLLOCATED ELECTRONICS AND TWO-WIRE INTERFACE

FIELD OF THE INVENTION

The depicted and described embodiments relate to a sensor with Micro Electro Mechanical Systems (MEMS) elements and on-board circuitry for power, thermal sensitivity compensation, and signal conditioning. The depicted and described embodiments also relate to a converter for providing power and signal conditioning for a sensor with MEMS elements.

BACKGROUND OF THE INVENTION

Transducers which are used to measure dynamic motion or force exist in extremely large variety, but virtually all consist of two general components: a mechanical structure designed such that the applied motion or force input causes an internal deflection proportional to that input, and an electrical element which measures that deflection in a manner that the electrical output of the sensor is proportional to the magnitude of the deflection. The transduction from deflection to an electrical parameter defines the generic term "transducers" for such devices.

The form of electrical output of a dynamic sensor can vary to include virtually any parameter that is electrically measurable. The most common measurement is the number of electrons (charge) displaced by a dynamic event; however, the measurement might also be the electric field strength (voltage) that caused those electrons to be displaced, or the ratio of charge to voltage (capacitance), the rate of electron flow (current), the ratio of voltage to current, (impedance or resistance), etc. As an example, the basic design of an accelerometer consists of a thin plate of piezoelectric (PE) material clamped between a "base" and a "mass", a piece of material which serves as an inertial component. When the mounting surface to which the base is attached is accelerated, the acceleration of that inertial mass will result in a force which causes the PE material to deform. The PE property will induce electrons to gather on one side of the plate. Electrodes attached to the appropriate surfaces of the plate lead to the electrical cable of the transducer.

Since electrons can be induced from a myriad of external sources, such as electrical fields or perhaps by the rubbing of insulators in the electrical wires delivering the output to the data acquisition, the prior art teaches specialized electronics and shielding techniques to reduce the errors caused by such external noise sources. One such technique is a circuit to perform an impedance conversion, internal to the sensor, which translates the quantity of electrons to a voltage level. The circuitry floods the output with sufficient electrons to maintain the voltage level, so that undesirable electrons induced by external fields and rubbing insulators do not significantly affect the overall output. These circuits are made by multiple manufacturers, under many trademarks (ICP®, ISOTRON®, DELTATRON®, etc), but all can be lumped under the term IEPE (for Internal Electronic PiezoElectric).

IEPE uses two wires: output and ground. The source of power for an IEPE device is a constant current. The current for a prior art IEPE circuit is not well regulated, which is adequate for use with a PE bridge sensor. The output of the IEPE device, which represents the time-varying dynamic input to the transducer, takes the form of an analogously time-varying voltage component added to the static voltage operating point of the IEPE circuit. Such circuitry has been extensively used in the industry, due to its advantages in reduced noise, reduced cable costs, simplicity of the associated external conditioning, etc.

One characteristic of IEPE devices is that the static voltage operation point does not vary analogously to the parameter to be measured, even if that parameter had significant static value. In contrast, there is another class of transducers the output of which does vary analogously with the static or low frequency inputs being measured. Such static measurements result in a direct current or DC output proportional to the static parameter to be measured. This DC coupling is in contrast to the alternating current or AC coupling characteristic of circuits such as IEPE, which provide no measurement information at static or low frequencies.

MEMS (Micro Electro Mechanical Systems) are DC coupled sensors used in accelerometers, particularly accelerometers incorporating a Wheatstone bridge of piezoresistive (PR) bridge strain gauges. These devices are used to measure static or low frequency values, and in addition are more successfully used in certain applications such as violent shock. More traditional PE transducers can respond with erroneous output caused by the event. An example of an error is a step change in output occurring during the most violent period of a shock (called "zero shift"). MEMS PR devices tend to perform well in such applications, not displaying such zero shift. The prior art teaches the use of a bridge sensor signal conditioner, external to the transducer, to address the requirements of Wheatstone bridges, for example, to provide a carefully controlled excitation voltage or current and specialized circuits to handle the common mode voltage and differential output of the bridge. A bridge sensor signal conditioner includes a highly regulated and therefore costly excitation voltage or current source, circuitry to vary the excitation voltage or current, and circuitry to subsequently adjust other parameters affected by the varying excitation voltage or current, such as gain. As a result, a bridge sensor signal conditioner is more complex and costly to manufacture and physically larger than the IEPE circuitry noted supra and more difficult and complicated to operate.

Thus, the prior art teaches that to use a bridge sensor signal conditioner with a sensor, the excitation voltage or current of the conditioner must be selected by the user, the parameters, such as gain, noted above, must subsequently be adjusted by the user, and trial runs made by the user to ensure that the various selections and adjustments have been properly made. Thus, the prior art also teaches against modularity of bridge sensor signal conditioners. For example, once a conditioner has been adjusted and tested for compatibility with a specific sensor, the conditioner cannot be used with another sensor, even a sensor of the same general type, without repeating the adjustment and testing noted above with respect to the other sensor.

FIG. 1 is a block diagram of a prior art bridge sensor transducer. As previously described, a PR sensor consists of a material that changes its electrical resistance as a function of the quantity to be measured—temperature, force, strain, etc. Such sensors are normally configured as a four legged Wheatstone bridge to maximize the output. FIG. 1 shows a typical sensor in a known Wheatstone bridge arrangement. Resistors Ra, Rb, Rc, and Rd are typically embodied in MEMS devices. The prior art teaches the use of bridge sensor signal conditioner and six lines connecting the bridge sensor to the bridge sensor signal conditioner. The excitation lines are used to provide power to the bridge sensor and the sense lines are used to address voltage regulation problems, for example, compensation for losses due to line lead length. The data acquisition signal (DAQ), the output of the bridge sensor signal conditioner bridge sensor signal conditioner, is analogous to an output of the IEPE device described supra. As noted above, the prior art teaches the use of a precise/well-regulated voltage or current source for the excitation lines and a series of adjustments and tests.

BRIEF SUMMARY OF THE INVENTION

The present invention broadly comprises a transducer, including: a housing; a bridge sensor circuit disposed within the housing and including at least one micro electro-mechanical systems (MEMS) sensing element and first and second output ports; circuitry disposed within the housing; and an input/output (I/O) line electrically connected to the circuitry, accessible at an exterior of the housing, and adapted for receipt of input voltage or current. The circuitry is for generating a single data signal that combines respective outputs of the first and second output ports, and transmitting the single data signal on the I/O line. The circuitry is for generating and transmitting to the bridge sensor circuit an excitation current or voltage using the input voltage or current.

The present invention also broadly comprises a signal converter, including: a housing; circuitry disposed within the housing; a plurality of converter input/output (I/O) lines accessible at an exterior of the housing and adapted for connection to a plurality of sensor I/O lines for a bridge sensor transducer, wherein the bridge sensor transducer includes a bridge sensor circuit with at least one micro electro-mechanical systems (MEMS) sensing element and wherein a first portion of the plurality of converter I/O lines are adapted to receive respective output signals from the bridge sensor circuit; and a converter I/O line accessible at the exterior of the housing and adapted for receipt of constant current power. The circuitry is for providing excitation power on a second portion of the plurality of converter I/O lines, generating a conversion signal that combines the respective output signals of the bridge sensor circuit, and transmitting the conversion signal on the I/O line.

The present invention further broadly comprises a transducer, including: a housing; a bridge sensor circuit disposed within the housing and including at least one micro electro-mechanical systems (MEMS) sensing element; circuitry disposed within the housing; and an input/output (I/O) line electrically connected to the circuitry, accessible at an exterior of the housing, and adapted for receipt of input voltage or current. The circuitry is for receiving output from the bridge sensor circuit and generating a conversion signal from the output from the bridge sensor circuit and the output from the bridge sensor circuit and the conversion signal each include a DC component.

The present invention broadly comprises a signal converter, including: a housing; circuitry disposed within the housing; a plurality of converter input/output (I/O) lines accessible at an exterior of the housing and adapted for connection to a plurality of sensor I/O lines for a bridge sensor transducer, wherein the bridge sensor transducer includes a bridge sensor circuit with at least one micro electro-mechanical systems (MEMS) sensing element and wherein a first portion of the plurality of converter I/O lines is adapted to receive an output, including a DC component, from the bridge sensor circuit; and a converter I/O line accessible at the exterior of the housing and adapted for receipt of constant current power. The circuitry is for providing excitation power on a second portion of the plurality of converter I/O lines, generating a conversion signal, including the DC component, from the output from the bridge sensor circuit, and transmitting the conversion signal on the I/O line.

The present invention also broadly comprises a transducer, including: a housing; a bridge sensor circuit disposed within the housing and including at least one micro electro-mechanical systems (MEMS) sensing element and first and second pluralities of sensor input/output (I/O) ports; a differential amplifier disposed within the housing and including first and second pluralities of amplifier I/O ports; a conversion circuit disposed within the housing and including a plurality of conversion I/O ports and first and second conversion I/O ports and first and second transducer I/O lines, accessible at an exterior of the housing, and electrically connected to the first and second conversion I/O ports, respectively. The first plurality of amplifier I/O ports is electrically connected to the first plurality of sensor I/O ports. The plurality of conversion I/O ports is electrically connected to the second plurality of amplifier I/O ports or the second plurality of sensor I/O ports.

In one embodiment, the conversion circuit is for providing power and a ground on at least some of the conversion I/O ports from the plurality of conversion I/O ports. In another embodiment, the second plurality of sensor I/O ports includes first and second sensor I/O ports and the conversion circuit is for providing power to the first sensor I/O port and ground to the second sensor I/O port. In one embodiment, the second plurality of amplifier I/O ports includes first and second amplifier I/O ports and the conversion circuit is for providing power to the first amplifier I/O port and ground to the second amplifier I/O port. In another embodiment, the first transducer I/O line is adapted for connection to a current source and the conversion circuit is for generating an excitation voltage using current on the first transducer I/O line from the current source. In one embodiment, the conversion circuit is for providing the excitation voltage on at least some conversion I/O ports from the plurality of conversion I/O ports.

In one embodiment, the first transducer I/O line is adapted for connection to a current source, the conversion circuit includes a third conversion I/O port and the second plurality of sensor I/O ports includes a first sensor I/O port electrically connected to the third conversion I/O port, and the conversion circuit is for supplying an excitation current, using current from the current source, at the third conversion I/O port. In another embodiment, the conversion circuit is for generating an operating voltage using current on the first transducer I/O line from the constant current source and the conversion circuit is for providing the operating voltage on at least some of the conversion I/O ports from the plurality of conversion I/O ports electrically connected to the second plurality of amplifier I/O ports.

In one embodiment, the first plurality of sensor I/O ports includes first and second sensor I/O ports, the first plurality of amplifier I/O ports include first and second amplifier I/O ports electrically connected to the first and second sensor I/O ports; the bridge sensor circuit is for generating respective electrical signals on the first and second sensor I/O ports; the second plurality of amplifier I/O ports includes a third amplifier I/O port; the amplifier circuit is for generating and providing on the third amplifier I/O port an amplifier signal representative of the respective electrical signals on the first and second sensor I/O ports; the plurality of conversion I/O ports includes a third conversion I/O port electrically connected to the third amplifier I/O port; and the conversion circuit is for generating and providing at the first conversion I/O port a conversion signal representative of the amplifier signal.

In one embodiment, the sensor circuit includes a Wheatstone bridge circuit with four resistor and wherein the at least one micro electro-mechanical systems (MEMS) sensing element includes the four resistors. In another embodiment, the conversion circuit includes a third conversion I/O port and the second plurality of amplifier I/O ports includes a first amplifier I/O port, and the transducer includes a filter circuit, disposed in the housing and including: a first filter I/O port electrically connected to the first amplifier I/O port; a second filter I/O port electrically connected to the third conversion I/O port; and a plurality of filter I/O ports electrically connected to the plurality of conversion I/O ports. In one embodiment, the conversion circuit is for providing power and a ground on at least some of the conversion I/O ports from the plurality of conversion I/O ports connected to the plurality of filter I/O ports. In another embodiment, the first plurality of sensor I/O ports includes first and second sensor I/O ports, the first plurality of amplifier I/O ports include first and second amplifier I/O ports electrically connected to the first and second sensor I/O ports; the bridge sensor circuit is for generating respective electrical signals on the first and second sensor I/O ports; the amplifier circuit is for generating and providing on the first amplifier I/O port an amplifier signal representative of the respective electrical signals on the first and second sensor I/O ports; the filter circuit is for electrically filtering the amplifier signal and supplying the filtered amplifier signal at the second filter I/O port; and the conversion circuit is for generating and providing at the first conversion I/O port a conversion signal representative of the filtered amplifier signal.

In one embodiment, the conversion circuit is for transmitting excitation power to the first plurality of sensor I/O ports, the differential amplifier is for receiving respective electrical signals, including a DC component, from the second plurality of sensor I/O ports, and the conversion circuit is for providing, on the first or second transducer I/O line, a conversion signal including the DC component.

The present invention further broadly comprises a signal converter, including: a housing; a first plurality of converter input/output (I/O) lines accessible at an exterior of the housing and adapted for connection to a plurality of sensor I/O lines for a bridge sensor transducer with at least one micro electro-mechanical systems (MEMS) sensing element; a second plurality of converter I/O lines accessible at the exterior of the housing; a differential amplifier disposed within the housing and including first and second pluralities of amplifier I/O ports; and a conversion circuit disposed within the housing and including a plurality of conversion I/O ports and first and second conversion I/O ports. At least some of the amplifier I/O ports from the first plurality of amplifier I/O ports are connected to at least some of the converter I/O lines from the first plurality of converter I/O lines, at least some of the conversion I/O ports from the plurality of conversion I/O ports are electrically connected to at least some of the amplifier I/O ports from the second plurality of amplifier I/O ports and to at least some of the converter I/O lines from the first plurality of converter I/O lines, and the first and second conversion I/O ports are electrically connected to the second plurality of converter I/O lines.

In one embodiment, the conversion circuit is for providing power and a ground on at least some of the first plurality of conversion I/O ports. In another embodiment, the first plurality of converter I/O lines includes first and second converter I/O lines and the conversion circuit is for providing power to the first converter I/O line and ground to the second converter I/O line. In one embodiment, the second plurality of amplifier I/O ports includes first and second amplifier I/O ports and wherein the conversion circuit is for providing power to the first amplifier I/O port and ground to the second amplifier I/O port.

In one embodiment, a first converter I/O line from the second plurality of converter I/O lines is adapted for connection to a current source and the conversion circuit is for generating an excitation voltage using current on the first converter I/O line from the constant current source. In another embodiment, the conversion circuit is for providing the excitation voltage on at least some conversion I/O ports from the first plurality of conversion I/O ports.

In one embodiment, a converter I/O line from the second plurality of converter I/O lines is adapted for connection to a current source and the conversion circuit is for supplying an excitation current, using current from the current source, to at least one conversion I/O port, from the plurality of conversion I/O ports, electrically connected to the first plurality of converter I/O lines. In another embodiment, the conversion circuit is for generating an operating voltage using current on the converter I/O line from the current source and the conversion circuit is for providing the operating voltage on at least one conversion I/O port, from the plurality of conversion I/O ports, electrically connected to at least one amplifier I/O port from the second plurality of amplifier I/O ports.

In one embodiment, the first plurality of converter I/O lines includes first and second converter I/O lines arranged to receive respective electrical signals generated by the bridge sensor transducer, the first plurality of amplifier I/O ports include first and second amplifier I/O ports electrically connected to the first and second converter I/O lines, respectively; the second plurality of amplifier I/O ports includes a third amplifier I/O port; the amplifier circuit is for generating and providing on the third amplifier I/O port an amplifier signal representative of the respective electrical signals on the first and second converter I/O lines; the plurality of conversion I/O ports includes a third conversion I/O port electrically connected to the third amplifier I/O port; and the conversion circuit is for generating and providing at the first conversion I/O port a conversion signal representative of the amplifier signal.

In one embodiment, the first plurality of converter input/output (I/O) lines is adapted for connection to a plurality of sensor I/O lines for a bridge sensor transducer including a Wheatstone bridge circuit with four micro electro-mechanical systems (MEMS) sensing elements. In another embodiment, the conversion circuit includes a third conversion I/O port and the second plurality of amplifier I/O ports includes a first amplifier I/O port, and the converter includes a filter circuit, disposed in the housing and including: a first filter I/O port electrically connected to the first amplifier I/O port; a second filter I/O port electrically connected to the third conversion I/O port; and a plurality of filter I/O ports electrically connected to the plurality of conversion I/O ports. In one embodiment, the conversion circuit is for providing power and a ground on at least some of the conversion I/O ports from the plurality of conversion I/O ports connected to the plurality of filter I/O ports.

In one embodiment, the first plurality of converter I/O lines includes first and second converter I/O lines arranged to receive respective electrical signals generated by the bridge sensor transducer, the first plurality of amplifier I/O ports include first and second amplifier I/O ports electrically connected to the first and second converter I/O lines, respectively; the amplifier circuit is for generating and providing on the first amplifier I/O port an amplifier signal representative of the respective electrical signals on the first and second converter I/O lines; the filter circuit is for electrically filtering the amplifier signal and supplying the filtered amplifier signal at the second filter I/O port; and the conversion circuit is for generating and providing at the first conversion I/O port a conversion signal representative of the filtered amplifier signal.

In one embodiment, the conversion circuit is for providing excitation power on the at least some of the conversion I/O ports from the plurality of conversion I/O ports electrically connected to the at least some of the converter I/O lines from the first plurality of converter I/O lines, the differential amplifier is for receiving respective electrical signals, including a DC component, on the at least some of the amplifier I/O ports from the first plurality of amplifier I/O ports connected to the at least some of the converter I/O lines from the first plurality of converter I/O lines, and the conversion circuit is for providing, on the second plurality of converter I/O lines, a conversion signal including the DC component.

The present invention also broadly comprises a method of generating a two-wire output for a bridge sensor transducer, a method of operating on a sensor signal from a transducer, and method of generating an output signal for a transducer.

It is a general object of the present invention to provide a system and means to provide a MEMS sensor with on-board electronics to enable interface with a less well-regulated power source, or a system and means to interface a MEMS sensor with a less well-regulated power source.

These and other objects and advantages of the present invention will be readily appreciable from the following description of preferred embodiments of the invention and from the accompanying drawings and claims.

BRIEF DESCRIPTION OF THE DRAWINGS

The nature and mode of operation of the present invention will now be more fully described in the following detailed description of the invention taken with the accompanying drawing figures, in which.

DETAILED DESCRIPTION OF THE INVENTION

At the outset, it should be appreciated that like drawing numbers on different drawing views identify identical, or functionally similar, structural elements of the invention. While the present invention is described with respect to what is presently considered to be the preferred aspects, it is to be understood that the invention as claimed is not limited to the disclosed aspects.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Figure 2:
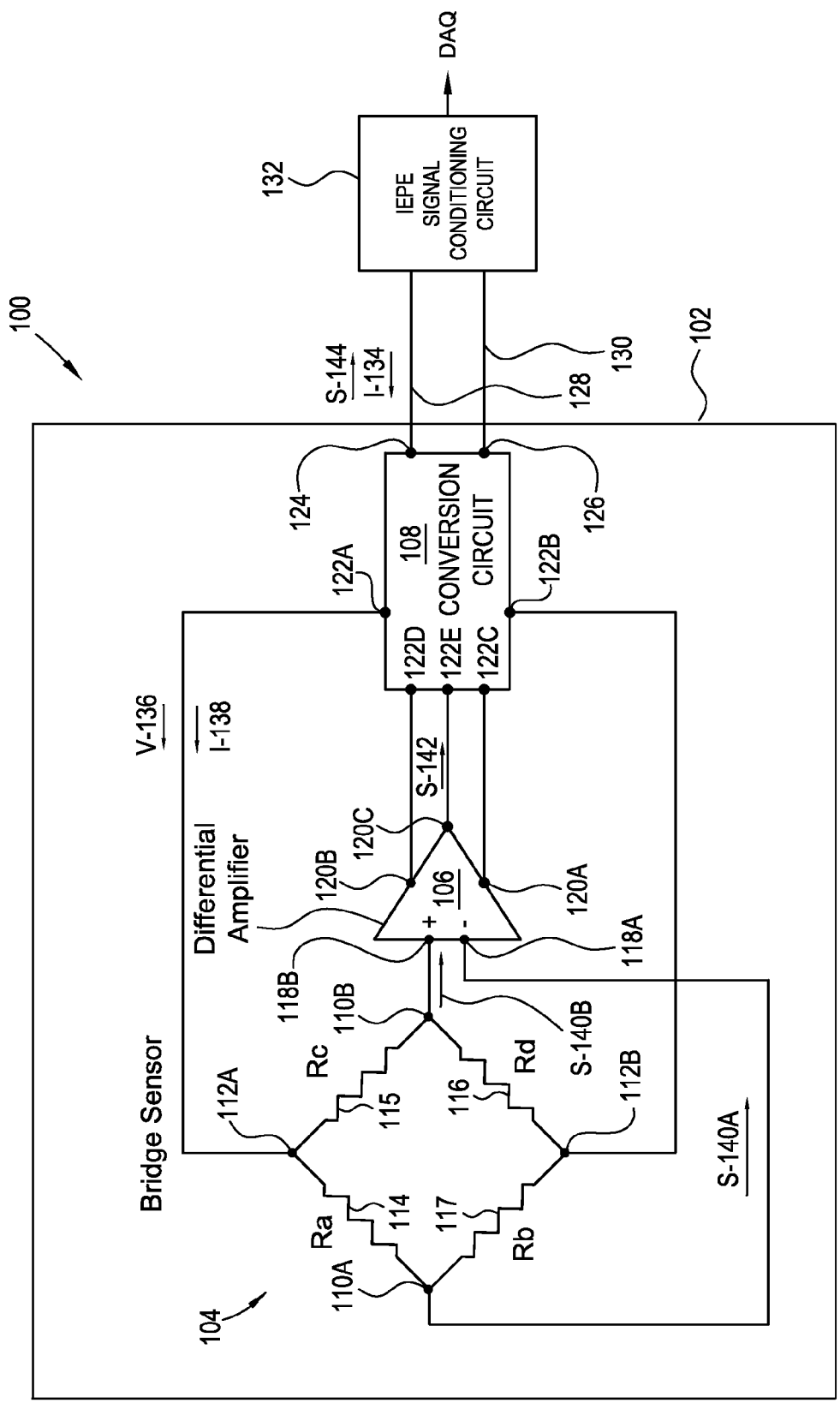
FIG. 2 is a block diagram of a present invention bridge sensor transducer.

FIG. 2 is a block diagram of present invention bridge sensor transducer 100. The transducer includes housing 102, bridge sensor circuit 104 disposed within the housing, differential amplifier 106 disposed within the housing, and conversion circuit, or Internal Electronic PiezoElectric (IEPE) conversion circuit, 108 disposed within the housing. As described infra, the conversion circuit converts input power into an output signal compatible with an IEPE signal conditioning device. The bridge sensor circuit includes at least one micro electro-mechanical systems (MEMS) sensing element and pluralities of sensor input/output (I/O) ports 110 and 112. In one embodiment, resistors, or sensing elements, 114-117 are included in a single MEMS unit. In another embodiment, sensing elements 114-117 are each a separate MEMS sensing element. Any MEMS sensing element known in the art can be used. The differential amplifier includes pluralities of amplifier I/O ports 118 and 120. I/O ports 118 are electrically connected to sensor I/O ports 110. In one embodiment, amplifier I/O ports 118 include amplifier I/O ports 118A and 118B.

The conversion circuit includes a plurality of conversion I/O ports 122 and conversion I/O ports 124 and 126. Conversion I/O ports 122 are electrically connected to amplifier I/O ports 120 or sensor I/O ports 112. Transducer 100 also includes transducer I/O lines 128 and 130, accessible at an exterior of the housing, and electrically connected to conversion I/O ports 124 and 126, respectively. Transducer I/O lines 128 and 130 are adapted for electrical connection to an unregulated power source, as described infra, for example, IEPE circuit 132.

The conversion circuit is for providing power and a ground on at least some of conversion I/O ports 122. In one embodiment, sensor I/O ports 112 include sensor I/O ports 112A and 112B and the conversion circuit is for providing power to sensor I/O port 112A via I/O port 122A and ground to sensor I/O port 112B via I/O port 122B. In one embodiment, amplifier I/O ports 120 include amplifier I/O ports 120A and 120B and the conversion circuit is for providing ground to amplifier I/O port 120A via I/O port 122C and power to amplifier I/O port 120B via I/O port 122D. It should be understood that a present invention transducer is not limited to the configuration of I/O ports shown or the function of the I/O ports shown. For example (not shown), power can be supplied to the bridge sensor circuit and the differential amplifier using a single conversion I/O port, ground can be supplied to the bridge sensor circuit and the differential amplifier using a single conversion I/O port, or a combination of single or multiple conversion I/O ports can be used to supply power and ground to the bridge sensor circuit and the differential amplifier.

In one embodiment, transducer I/O line 128 or 130 is adapted for electrical connection to a current source, for example, a constant current source in an IEPE signal conditioning device, such as IEPE signal conditioning circuit 132. The other of 128 and 130 is a ground line. Line 128 is shown receiving current, for example, constant current I-134 from circuit 132; however, it should be understood that line 130 also can receive the current. In one embodiment, the conversion circuit generates excitation or operating voltage V-136 using current I-134 and supplies voltage V-136 on at least some of conversion I/O ports 122, for example, 122A and 122C.

In another embodiment, the conversion circuit generates excitation or operating voltage V-136 and excitation constant current I-138 using current I-134, and supplies the excitation or operating voltage and constant current I-138 on at least some of conversion I/O ports 122, for example, providing current I-138 on I/O port 122A and the operating voltage on I/O port 122C. Thus, a present invention transducer supplies a properly regulated excitation current or voltage to the bridge sensor circuit, as further described infra.

In one embodiment, plurality of sensor I/O ports 110 include sensor I/O ports 110A and 10B electrically connected to amplifier I/O ports 118A and 118B, respectively, and the bridge sensor circuit is for generating electrical signals S-140A and S-140B on sensor I/O ports 110A and 110B, respectively. As is known in the art, electrical signals S-140A and S-140B are representative of at least one physical parameter impacting the transducer and the bridge sensing circuit in particular. Plurality of amplifier I/O ports 120 includes amplifier I/O port 120C and the amplifier circuit is for generating and providing on amplifier I/O port 120C an amplifier signal S-142, representative of, or combining, electrical signals S-140A and S-140B, as is known in the art. The plurality of conversion I/O ports 122 includes conversion I/O port 122E electrically connected to amplifier I/O port 120C and the conversion circuit is for generating and providing at conversion I/O port 124 conversion signal S-144 representative of, or combining, the amplifier signal and meeting the requirements for an input signal for the power source, for example, the IEPE circuit. Thus, in one embodiment, the conversion circuit converts the differential output of the bridge sensor circuit, for example, signals S-140A and S-140B as represented by signal S-142, to single ended output signal S-144 by adding S-142 to an operating bias of circuit 132.

In one embodiment, the output voltage between transducer I/O line 128 and 130 includes a DC component, or bias. As described supra, MEMS sensing elements are DC coupled. That is, a MEMS sensing device can provide an output with a DC component that represents static conditions being measured by the MEMS sensor. For example, if the DC component of the output is 12V and the bridge sensor circuit responds to a change to the (nearly) static acceleration that would correspond to 0.2V of additional output, the DC component of the output of line 128 changes from the original 12V value to 12.2V. The difference is proportional to the change in static acceleration. Thus, the bridge sensing circuit is advantageously able to generate an output, for example, S-140A/B, including information regarding static or low frequency values. As described supra, the differential amplifier operates on the bridge sensing circuit output, for example, signals S-140A/B, and the conversion circuit operates on the output of the differential amplifier, for example, signal S-142 to generate and transmit an output signal, for example, S-144 including a DC component. The DC component includes the information regarding the static or low frequency conditions being measured by the bridge sensor circuit. That is, the transducer operates in a manner which preserves the DC-coupled nature of the bridge sensing circuit.

Figure 3:
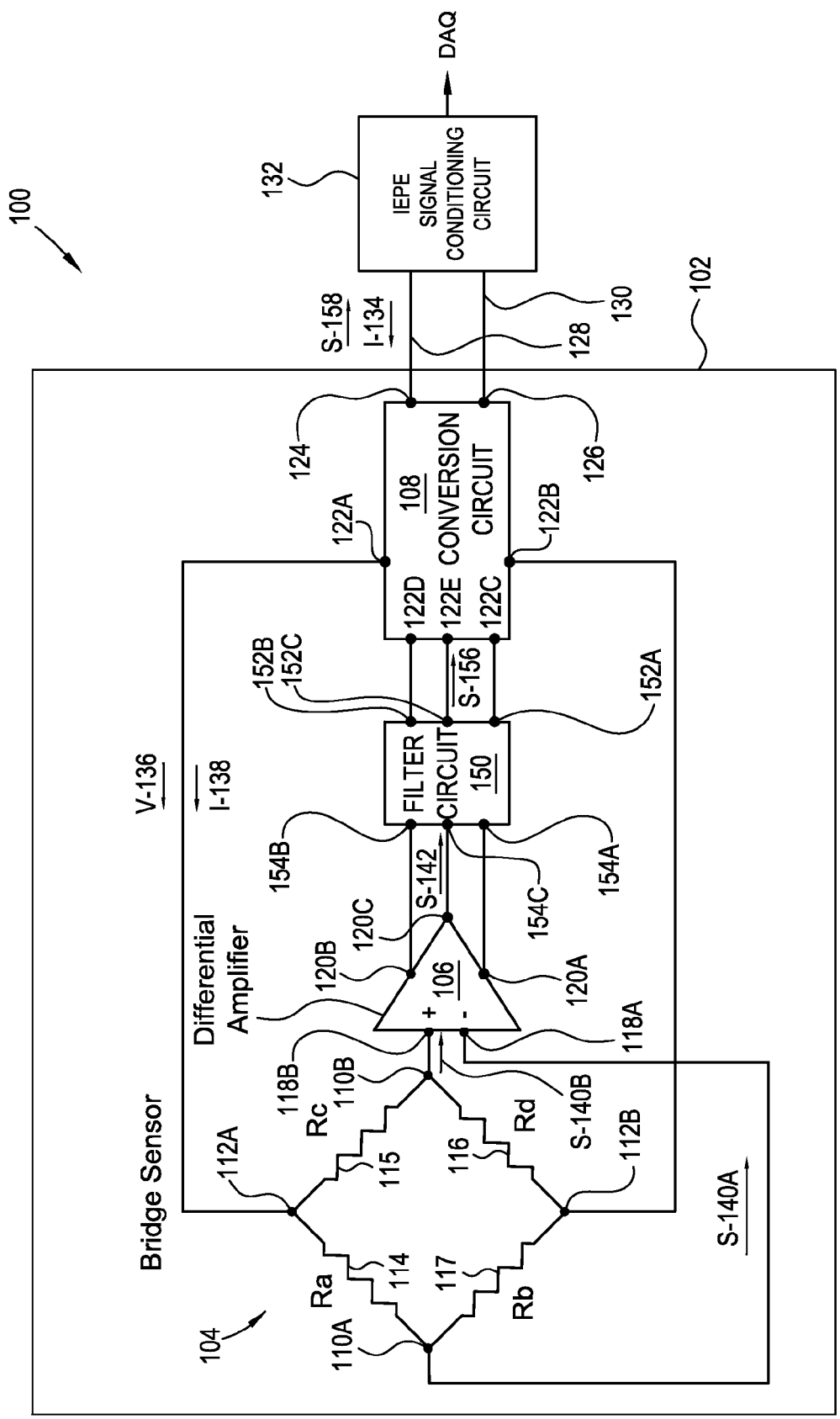
FIG. 3 is a block diagram of a present invention bridge sensor transducer with filtering.

FIG. 3 is a block diagram of bridge sensor transducer 100 with filtering. In one embodiment, transducer 100 includes filter circuit 150 with pluralities of filter I/O ports 152 and 154. The operation of the conversion circuit with respect to supplying power and ground, the operation of the bridge sensor circuit, and the operation of the differential amplifier, as described for FIG. 2, are substantially the same in FIG. 3, with the following considerations. In one embodiment, the conversion circuit provides ground on conversion I/O port 122C and power on conversion I/O port 122D; however, conversion I/O port 122C and 122D are electrically connected to filter I/O ports 152A and 152B, respectively, to provide ground and power to the filter circuit. Filter I/O ports 154A and 154B are electrically connected to amplifier I/O ports 120A and 120B to supply power and ground, from the conversion circuit, to the differential amplifier. It should be understood that a present invention transducer is not limited to the configuration of I/O ports shown or the function of the I/O ports shown. For example (not shown), power and/or ground can be supplied to the differential amplifier by bypassing the filter circuit using separate respective conversion I/O ports (not shown). Also, any combination of single or multiple conversion I/O ports can be used to supply power and ground to the bridge sensor circuit, the differential amplifier, and the filter circuit.

The filter circuit receives signal S-142 at filter I/O port 154C and electrically filters the signal as is known in the art to supply filtered amplifier signal S-156 at filter I/O port 152C. The conversion circuit generating and provides signal S-158 at conversion I/O port 124, representative of, or combining, the filtered amplifier signal and meeting the requirements for an input signal for the power source, for example, the IEPE circuit. Thus, in one embodiment, the conversion circuit converts the differential output of the bridge sensor circuit, for example, signals S-140A and S-140B as represented by signal S-156, to single ended output signal S-158 by adding S-156 to an operating bias of circuit 132.

In one embodiment, the output voltage between transducer I/O line 128 and 130 includes a DC component, or bias. As described supra, MEMS sensing elements are DC coupled. That is, a MEMS sensing device can provide an output with a DC component that represents static conditions being measured by the MEMS sensor. For example, if the DC component of the output is 12V and the bridge sensor circuit responds to a change to the (nearly) static acceleration that would correspond to 0.2V of additional output, the DC component of the output of line 128 changes from the original 12V value to 12.2V. The difference is proportional to the change in static acceleration. Thus, the bridge sensing circuit is advantageously able to generate an output, for example, S-140A/B, including information regarding static or low frequency values. As described supra, the differential amplifier operates on the bridge sensing circuit output, for example, signals S-140A/B, the filter operates on an output of the differential amplifier, for example, signal S-142, and the conversion circuit operates on the output of the filter, for example, signal S-156 to generate and transmit an output signal, for example, S-158 including a DC bias. The DC bias includes the information regarding the static or low frequency conditions being measured by the bridge sensor circuit.

Figure 4:
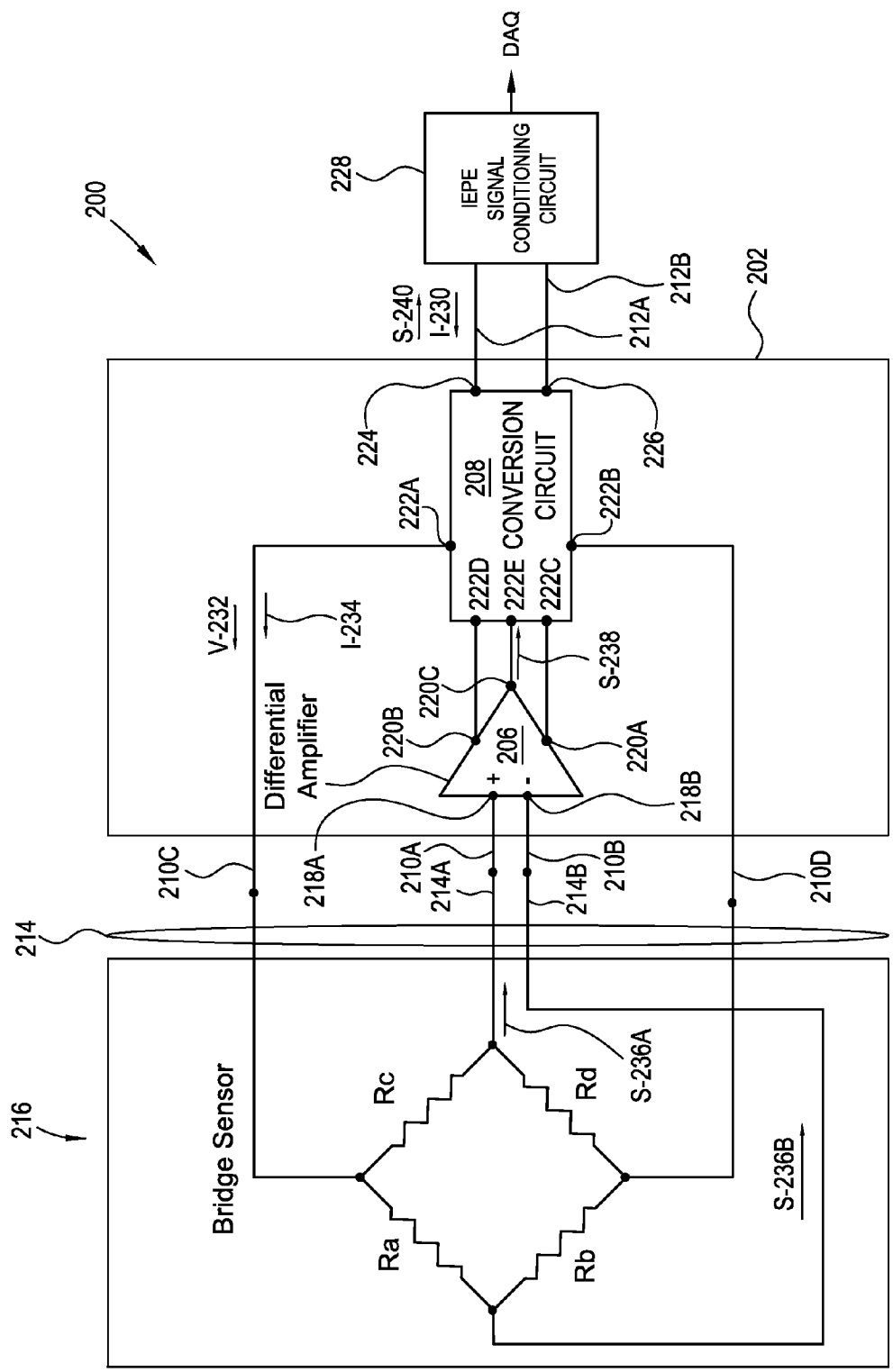
FIG. 4 is a block diagram of a present invention signal converter for use with a bridge sensor.

FIG. 4 is a block diagram of present invention converter 200 for use with a bridge sensor. The converter includes housing 202, differential amplifier 206 disposed within the housing, conversion circuit, or IEPE conversion circuit, 208 disposed within the housing, and pluralities of converter input/output (I/O) lines 210 and 212, accessible at an exterior of the housing. Plurality of converter I/O lines 210 is adapted for connection to a plurality of sensor I/O lines for a bridge sensor transducer, for example plurality of sensor I/O lines 214, accessible at an exterior of bridge sensor 216. Sensor 216 includes a bridge sensing circuit with any MEMS devices known in the art, for example, Ra-Rd. The differential amplifier includes pluralities of amplifier I/O ports 218 and 220 and at least some of the amplifier I/O ports from plurality of amplifier I/O ports 218 are electrically connected to at least some of the converter I/O lines from plurality of converter I/O lines 210, for example, ports 218A and 218B are electrically connected to lines 210A and 210B, respectively.

The conversion circuit includes plurality of conversion I/O ports 222 and conversion I/O ports 224 and 226. At least some of the conversion I/O ports from plurality of conversion I/O ports 222 are electrically connected to at least some of the amplifier I/O ports from the plurality of amplifier I/O ports 220 and to at least some of the converter I/O lines from plurality of converter I/O lines 210, for example, ports 222A and 222B are connected to lines 210C and 210D, respectively, and ports 222C and 222D are connected to ports 220A and 220B, respectively. Conversion I/O ports 224 and 226 are electrically connected to the plurality of converter I/O lines 212, for example, to lines 212A and 212B, respectively.

The conversion circuit is for providing power and a ground on at least some of conversion I/O ports 222. In one embodiment, the conversion circuit is for providing power on converter I/O port 222A and ground on converter I/O port 222B. In one embodiment, the conversion circuit is for providing ground on converter I/O port 222C and power on converter I/O port 222D. It should be understood that a present invention converter is not limited to the configuration of I/O ports shown or the function of the I/O ports shown. For example (not shown), power can be supplied to converter I/O lines 210 and the differential amplifier using a single conversion I/O port, ground can be supplied to converter I/O lines 210 and the differential amplifier using a single conversion I/O port, or a combination of single or multiple conversion I/O ports can be used to supply power and ground to converter I/O lines 210 and the differential amplifier.

In one embodiment, a converter I/O line from plurality of converter I/O lines 212 is adapted for electrical connection to an unregulated current source as described infra, for example, in circuit 228, and another converter I/O line from plurality of converter I/O lines 212 is a ground line. For example, converter I/O line 212A is shown receiving a constant current, for example, constant current I-230, from a substantially unregulated current source (not shown) in circuit 228; however, it should be understood that the connections of lines 212A and 212B can be reversed. In one embodiment, the conversion circuit generates excitation or operating voltage V-232 using current I-230 and supplies V-232 on at least some of conversion I/O ports 222, for example, 222A and 222C.

In another embodiment, the conversion circuit generates excitation or operating voltage V-232 and constant excitation current I-234 using current I-230 and supplies voltage V-232 and constant current I-234 on at least some of conversion I/O ports 222, for example, providing current I-234 on I/O port 222A and voltage V-232 on port 222C. Thus, a present invention converter supplies a properly regulated excitation current or voltage for bridge sensor, as further described infra.

In one embodiment, converter I/O lines 210A and 210B are for receiving electrical signals S-236A and S-236B from sensor lines 214A and 214B, respectively. As is known in the art, electrical signals S-236A and S-236B are representative of at least one physical parameter impacting the bridge sensor and the bridge sensing circuit in particular. Plurality of amplifier I/O ports 220 includes amplifier I/O port 220C and the amplifier circuit is for generating and providing on amplifier I/O port 220C amplifier signal S-238, representative of, or combining, electrical signals S-236A and S-236B, as is known in the art. The plurality of conversion I/O ports 222 includes conversion I/O port 222E electrically connected to amplifier I/O port 220C and the conversion circuit is for generating and providing at conversion I/O port 224 conversion signal S-240 representative of the amplifier signal and meeting the requirements for an input signal for the power source, for example, the IEPE circuit. Thus, in one embodiment, the conversion circuit converts the differential output of the bridge sensor circuit, for example, signals S-236A and S-236B as represented by signal S-238, to single ended output signal S-240 by adding S-238 to an operating bias of circuit 228.

A filter circuit (not shown) can be added to converter 200. In this case, the discussion in the description for FIG. 3 regarding filter circuit 150 is applicable to converter 200.

In one embodiment, the output voltage between transducer I/O line 212A and 212B includes a DC component, or bias. As described supra, MEMS sensing elements are DC coupled. That is, a MEMS sensing device can provide an output with a DC component that represents static conditions being measured by the MEMS sensor. For example, if the DC component of the output is 12V and the bridge sensor circuit responds to a change to the (nearly) static acceleration that would correspond to 0.2V of additional output, the DC component of the output of line 212A changes from the original 12V value to 12.2V. The difference is proportional to the change in static acceleration. Thus, the bridge sensing circuit is advantageously able to generate an output, for example, S-236A/B, including information regarding static or low frequency values. As described supra, the differential amplifier operates on the bridge sensing circuit output, for example, signals S-236A/B, the conversion circuit operates on the output of the differential amplifier, for example, signal S-238 to generate and transmit an output signal, for example, S-240 including a DC bias. The DC bias includes the information regarding the static or low frequency conditions being measured by the bridge sensor.

The following should be viewed in light of FIGS. 2 through 4. Although the following discussion uses FIGS. 2 and 3 as examples, it should be understood that the discussion also is applicable to a present invention converter, for example, as described for FIG. 4. A sensor with MEMS elements requires excitation power with a maximum range of about +/−1% of a reference level. In one embodiment, excitation power generated by the conversion circuit, for example, V-136, I-138, V-232, or I-238, is within a maximum range of about +/−1% of a reference level. In another embodiment, excitation power generated by the conversion circuit, for example, V-136, I-138, V-232, or I-238, is within a maximum range of about +/−0.5% of a reference level. The output of a sensor with MEMS elements, for example, sensor 104, is linearly proportional to the excitation power. In one embodiment, an output signal generated by the conversion circuit, for example, S-144, S-158, or S-240, is within a maximum range of +/−1% of a reference level. In another embodiment, an output signal generated by the conversion circuit, for example, S-144, S-158, or S-240, is within a maximum range of about +/−1% of a reference level. In one embodiment, an output signal generated by the conversion circuit, for example, S-144, S-158, or S-240, is within a maximum range of about +/−0.5% of a reference level.

Figure 1:
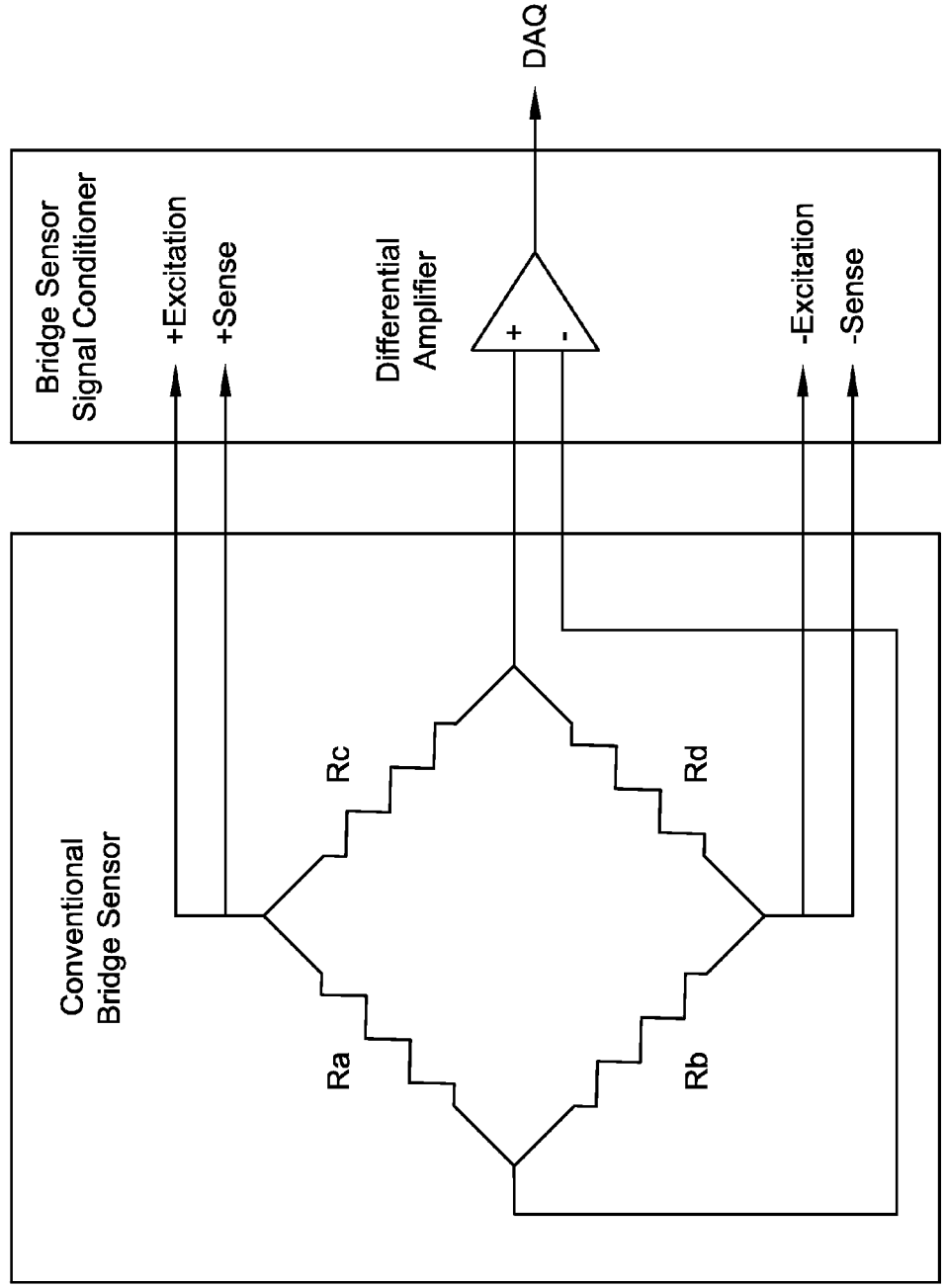
FIG. 1 is a block diagram of a prior art bridge sensor transducer arrangement.

The following should be viewed in light of FIGS. 1-4. In contrast, and as described supra, the range for excitation power generated from an IEPE device, for example, the excitation shown in FIG. 1, is far in excess of the range required for a sensor with MEMS elements. For example, a typical range of value for a current output from an IEPE device, for example, current I-134 or current I-230, is about 18-30V at about 2-20 mA of constant current. Thus, the excitation power of the IEPE device is unusable in a sensor with MEMS elements, for example, sensor 104, without further conditioning, for example, as provided by conversion circuit 108. For example, typical output bias range of a PE sensor receiving excitation from an IEPE device is 12-14V with an output swing of +/−5V. Returning to FIGS. 2 through 4, advantageously, a present invention transducer or converter enables the use of relatively less well-regulated, less costly, and more available power sources, for example, IEPE circuits, for example, IEPE circuit 132, in place of the Bridge Sensor Signal Conditioners described supra. For example, the more costly regulated current source in the Bridge Sensor Signal Conditioners is not necessary to excite a bridge sensor with MEMS components. Instead, current from the less well-regulated current source in an IEPE circuit can be used by a present invention transducer or converter, for example, by conversion circuit 108, to generate a well regulated excitation voltage or current. Also, since a present invention transducer or converter does not require a power input with the same level of regulation as the Bridge Sensor Signal Conditioners described supra, the costly shielded multi-conductor to interface with a transducer is no longer needed.

Advantageously, a present invention transducer or converter is easier for an end user to use than the prior art combination of a MEMS bridge sensor and a bridge sensor signal conditioner described supra and is more likely to produce accurate results. For example, the selection of a power level and adjustment other parameters, such as gain, is simplified. Also, there may be more modularity with a present invention transducer or converter as the operations needed to use a present invention transducer or converter with ancillary equipment can be reduced.

Figure 5:
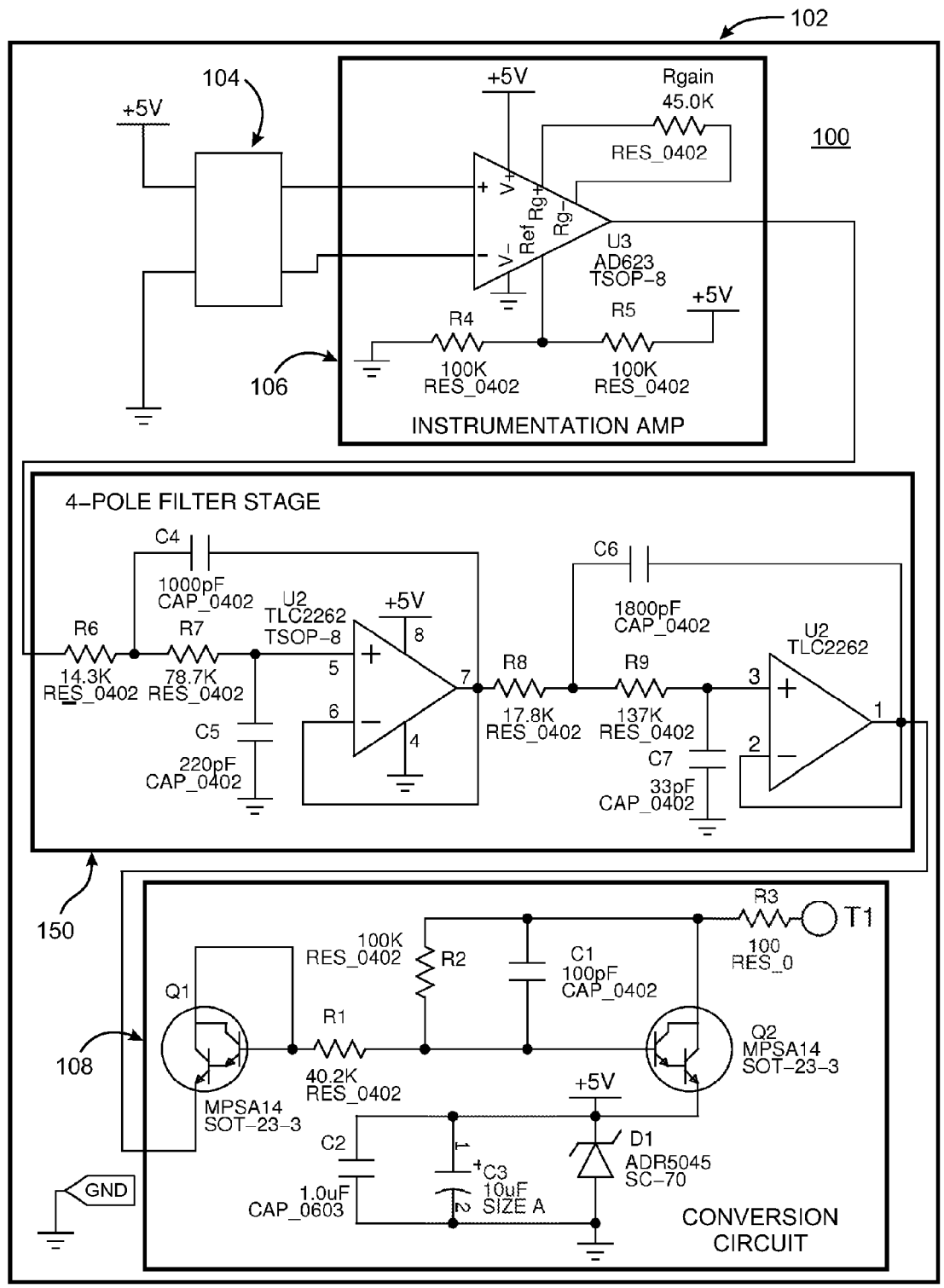
FIG. 5 is an example schematic of a present invention bridge sensor transducer with filtering.

FIG. 5 is an example schematic drawing of a present invention bridge sensor transducer with filtering, for example, as shown in FIGS. 2 and 3.

Figure 6:
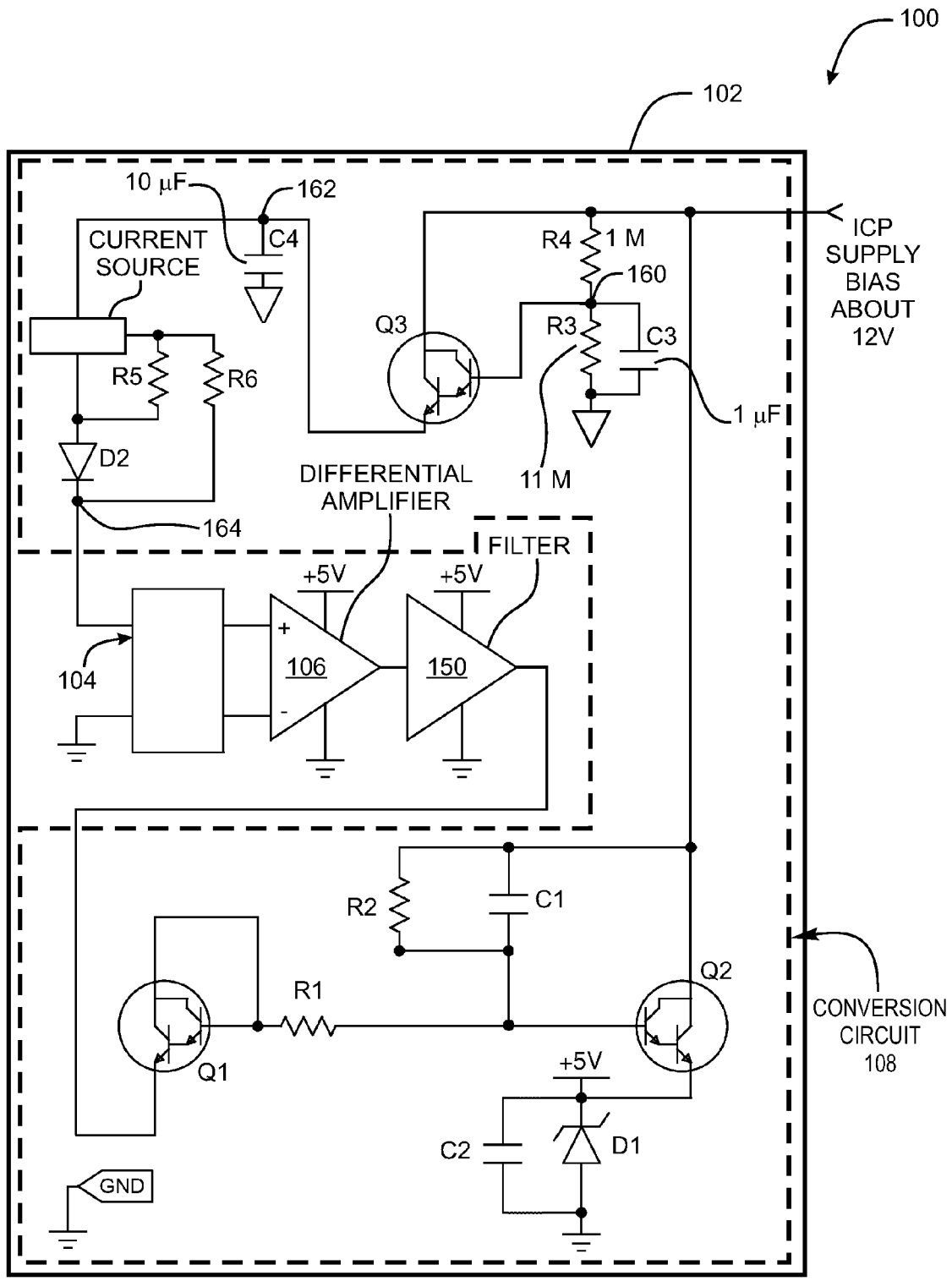
FIG. 6 is an example schematic of a present invention bridge sensor transducer with filtering and a thermally adjusted current input to the bridge sensor circuit.

FIG. 6 is an example schematic of a present invention bridge sensor transducer with filtering and a thermally adjusted current source to the bridge sensor circuit to serve as thermal sensitivity compensation for MEMS sensors.

Figure 7:
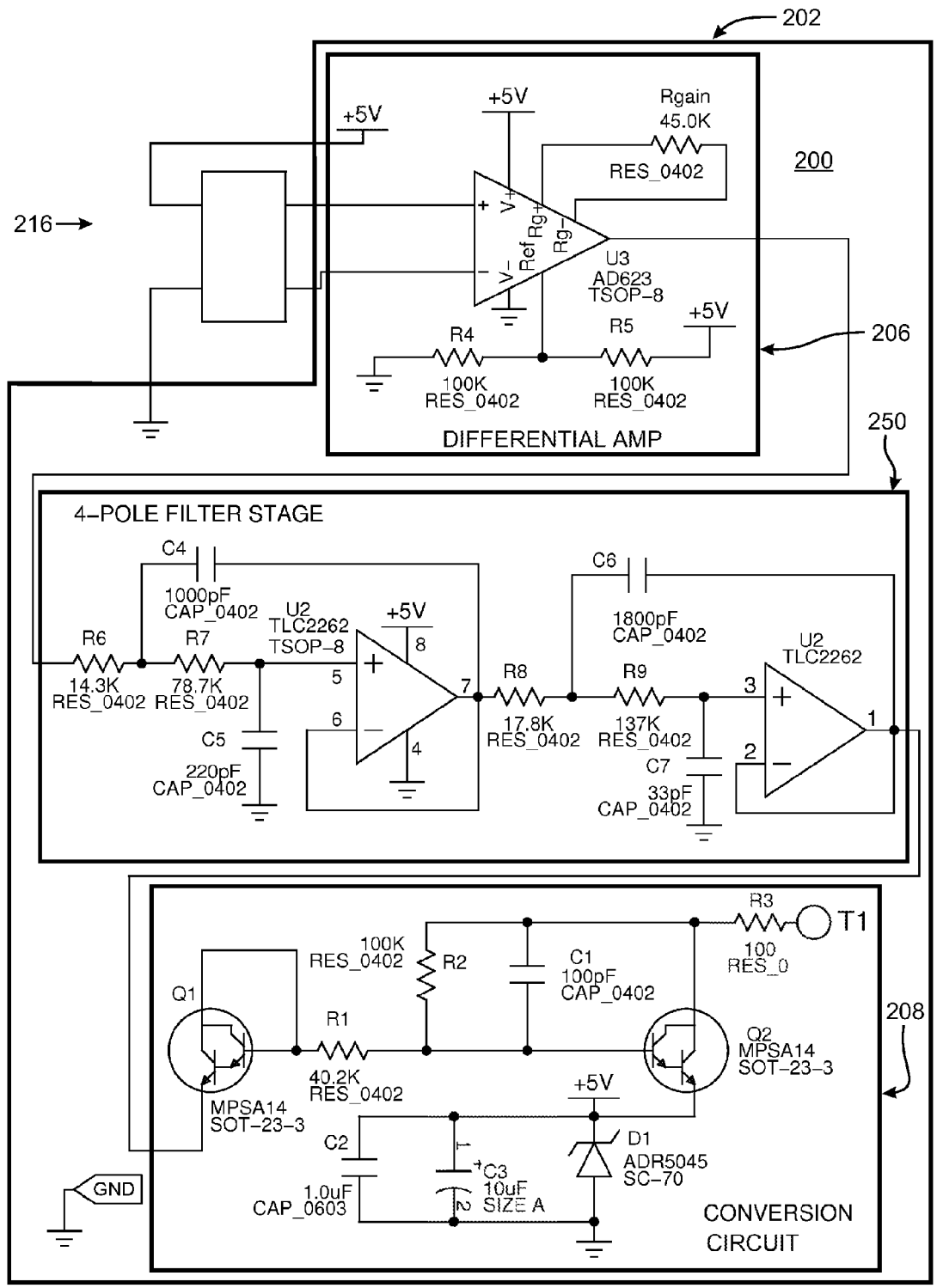
FIG. 7 is an example schematic of a present invention signal converter for use with a bridge sensor; and, FIG. 8 is an example schematic of a present invention signal converter for use with a bridge sensor and with filtering and a thermally adjusted current output for the bridge sensor circuit.

FIG. 7 is an example schematic of a present invention signal converter for use with a bridge sensor.

Figure 8:
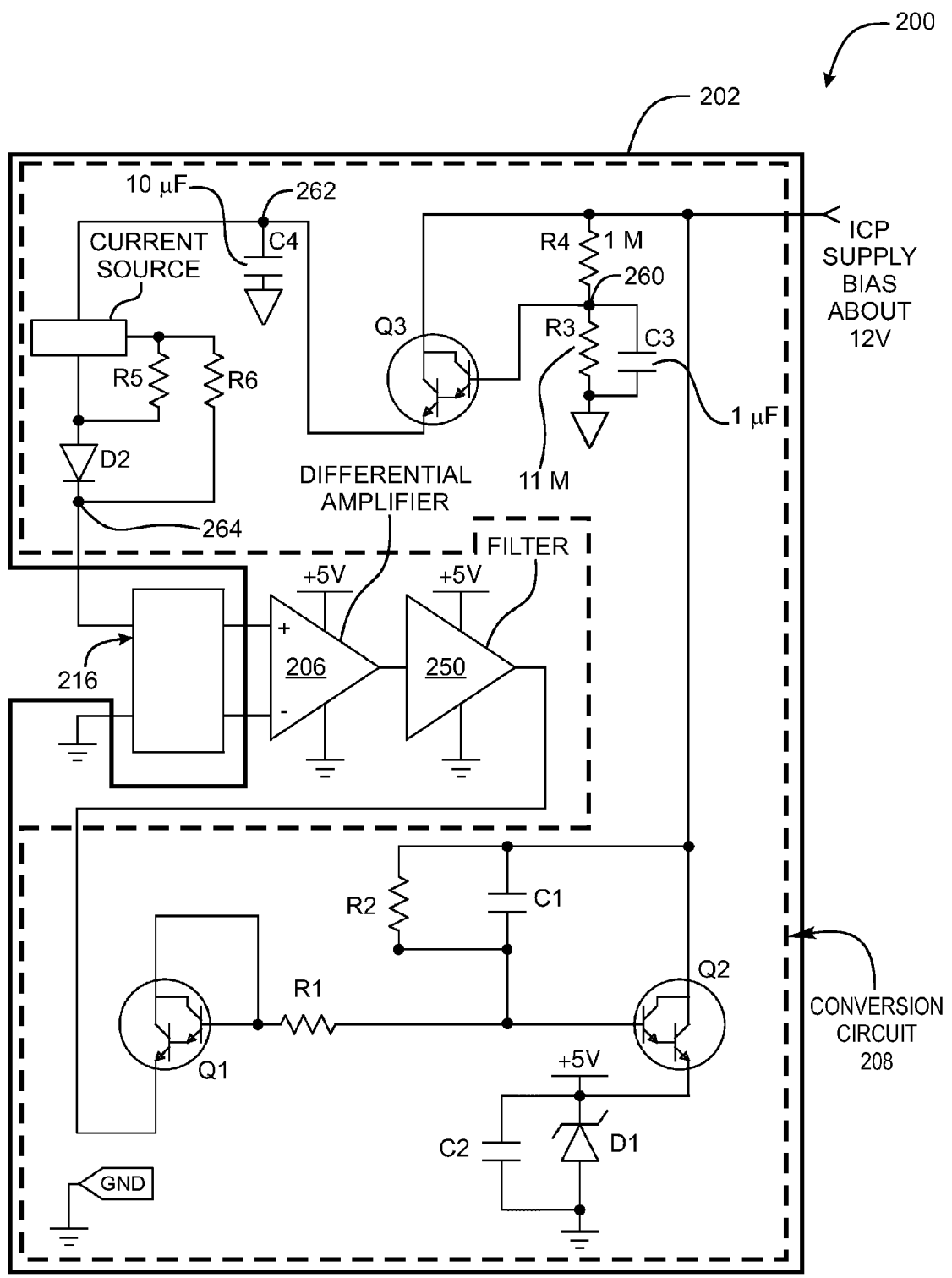

FIG. 8 is an example schematic of a present invention signal converter for use with a bridge sensor and with filtering and a thermally adjusted current output for the bridge sensor circuit. The following should be viewed in light of FIGS. 5 through 8. As is understood in the art, FIGS. 5 through 8 are schematic drawings intended to show electrical characteristics and configurations of present invention devices, such as transducer 100 or signal converter 200, and are not meant to be a literal or pictorial representation of the components and interconnection of components of present invention devices, such as transducer 100 or signal converter 200. With the preceding in mind, it is understood that the actual location and configuration of I/O ports and lines connecting I/O ports can be implemented in myriad fashion. It is understood that any location and configuration of I/O ports and lines connecting I/O ports that preserves the operations of a present invention transducer or converter, described supra and infra, can be used. It should be understood that the values for components shown in FIGS. 5 through 8, such as resistors and capacitors, are exemplary only and that other values for components shown in FIGS. 5 through 8 are included in the spirit and scope of the claimed invention. It also should be understood that other type, number, and configuration of components, not shown in FIGS. 5 through 8, to accomplish the functions described supra or infra for transducer 100 or converter 200 are included in the spirit and scope of the claimed invention.

In the exemplary schematic of FIG. 5, bridge sensor circuit 104, differential amplifier 106, conversion circuit 108, and filter 150 are shown. The conversion circuit includes transistors Q1 and Q2, resistors R1-R3, capacitors C1-C3, and diode D1. The operating voltage is about +5V.

In the exemplary schematic of FIG. 6, bridge sensor circuit 104, differential amplifier 106, conversion circuit 108, and filter 150 are shown. In addition, a thermally adjustable current is disposed between the differential amplifier and the bridge sensor circuit. Thus, a thermally adjusted current is supplied at node 164. The ICP supply bias is about 12V; at node 160, voltage is about 11V; at node 162, voltage is about 9.8V; and at node 164, voltage is about 7V and current is about 1 mA. The conversion circuit includes transistors Q1-Q3, resistors R1-R6, capacitors C1-C4, diode D1, and a current source. The operating voltage is about +5V.

In the exemplary schematic of FIG. 7, sensor 216, differential amplifier 206, conversion circuit 208, and filter 250 are shown. The conversion circuit includes transistors Q1 and Q2, resistors R1-R3, capacitors C1-C3, and diode D1. The operating voltage is about +5V.

In the exemplary schematic of FIG. 8, sensor 216, differential amplifier 206, conversion circuit 208, and filter 250 are shown. In addition, a thermally adjustable current is disposed between the differential amplifier and the bridge sensor circuit. Thus, a thermally adjusted current is supplied at node 264. The ICP supply bias is about 12V; at node 260, voltage is about 11V; at node 262, voltage is about 9.8V; and at node 264, voltage is about 7V and current is about 1 mA. The conversion circuit includes transistors Q1-Q3, resistors R1-R6, capacitors C1-C4, diode D1, and a current source. The operating voltage is about +5V.

It should be understood that the discussion of a DC component in signals and the DC coupling of a MEMS sensor in the description of FIGS. 2-4 is applicable to FIGS. 5-8.

The following should be viewed in light of FIGS. 2 through 8. The following describes a present invention method for generating a two-wire output for a bridge sensor transducer. Although the method is presented as a sequence of steps for clarity, no order should be inferred from the sequence unless explicitly stated. A first step accepts a first constant current on a two-wire line accessible at the exterior of a housing for the transducer; and, within the housing for the transducer: a second step generates an operating voltage or a second constant current using the first constant current on the two-wire line; a third step supplies the operating voltage or the second constant current to a bridge sensor circuit, the bridge sensor circuit including at least one micro electro-mechanical systems (MEMS) sensing element; a fourth step outputs, from the bridge sensor circuit and responsive to the operating voltage or the second constant current, first and second bridge sensor output signals; a fifth step generates a data signal representative of the first and second bridge sensor output signals; and a sixth step outputs, on the two-wire line, the data signal.

The following describes a present invention method for operating on a sensor signal for a transducer. Although the method is presented as a sequence of steps for clarity, no order should be inferred from the sequence unless explicitly stated. A first step accepts a first constant current on a two-wire line accessible at the exterior of a housing for a converter element; a second step generates, within the housing for the converter element, an operating voltage or a second constant current using the first constant current on the two-wire line; a third step supplies, on a plurality of converter input/output (I/O) lines accessible at the exterior of the housing, the operating voltage or the second constant current, wherein the plurality of converter I/O lines are adapted for electrical connection to respective I/O lines for a bridge sensor transducer, the bridge sensor including at least one micro electro-mechanical systems (MEMS) sensing element; a fourth step accepts, on first and second converter I/O lines accessible at the exterior of the housing and adapted for electrical connection to first and second I/O lines, respectively, for the transducer, first and second bridge sensor output signals, respectively, the first and second bridge sensor output signals generated responsive to the operating voltage or the second constant current; and a fifth step outputs, on the two-wire line, a data signal representative of the first and second bridge sensor output signals.

The following describes a present invention method of generating an output signal for a transducer. Although the method is presented as a sequence of steps for clarity, no order should be inferred from the sequence unless explicitly stated. A first step receives, on an input/output (I/O) line electrically connected to circuitry in a housing and accessible at an exterior of the housing, input voltage or current. The circuitry is connected to a bridge sensor circuit disposed within the housing and includes at least one micro electro-mechanical systems (MEMS) sensing element and first and second output ports; a second step generates, using the circuitry, a data signal that combines respective outputs of the first and second output ports of the bridge sensor circuit; and a third step transmits the DC-coupled data signal on the I/O line.

The following describes a present invention method for operating on a sensor signal for a transducer. Although the method is presented as a sequence of steps for clarity, no order should be inferred from the sequence unless explicitly stated. A first step accepts constant current power on a converter input/output (I/O) line accessible at the exterior of a housing; a second step connects a plurality of converter I/O lines accessible at the exterior of the housing with a plurality of sensor I/O lines for a bridge sensor transducer, the bridge sensor transducer including a bridge sensor circuit with at least one micro electro-mechanical systems (MEMS) sensing element; a third step provides, using circuitry disposed within the housing, excitation power for the bridge sensor circuit on the plurality of converter I/O lines; a fourth step receives, on the plurality of converter I/O lines, respective outputs from the bridge sensor circuit; a fifth step generates, using the circuitry disposed within the housing, a data signal that combines the respective outputs from the bridge sensor circuit; and a sixth step transmitting the DC-coupled data signal on the converter I/O line.

The following describes a present invention method of generating an output signal for a transducer. Although the method is presented as a sequence of steps for clarity, no order should be inferred from the sequence unless explicitly stated. A first step receives, on an input/output (I/O) line electrically connected to circuitry in a housing and accessible at an exterior of the housing, input voltage or current. The circuitry is connected to a bridge sensor circuit disposed within the housing and including at least one micro electro-mechanical systems (MEMS) sensing element and first and second output ports. A second step generates, using the circuitry, a conversion signal, with a DC component, that combines respective outputs of the first and second output ports of the bridge sensor circuit. A third step transmits the conversion signal on the I/O line.

The following describes a present invention method for operating on a sensor signal for a transducer. Although the method is presented as a sequence of steps for clarity, no order should be inferred from the sequence unless explicitly stated. A first step accepts constant current power on a converter input/output (I/O) line accessible at the exterior of a housing. A second step connects a plurality of converter I/O lines accessible at the exterior of the housing with a plurality of sensor I/O lines for a bridge sensor transducer, the bridge sensor transducer including a bridge sensor circuit with at least one micro electro-mechanical systems (MEMS) sensing element. A third step provides, using circuitry disposed within the housing, excitation power for the bridge sensor circuit on the plurality of converter I/O lines. A fourth step receives, on the plurality of converter I/O lines, respective outputs, with a DC component, from the bridge sensor circuit. A fifth step generates, using the circuitry disposed within the housing, a conversion signal, with the DC component, that combines the respective outputs from the bridge sensor circuit. A sixth step transmits the conversion signal on the converter I/O line.

It should be understood that in some aspects of one or more of the above methods, an excitation voltage is supplied to a bridge sensor and that in other aspects of one or more of the above methods, an excitation current with compensation for thermal sensitivity shifts is supplied to a bridge sensor.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention.

What we claim is:

1. A method of generating a two-wire output for a bridge sensor transducer, comprising the steps of:
   accepting a first constant current from an internal electronic piezoelectric (IEPE) compatible two-wire current source on a two-wire line accessible at the exterior of a housing for the transducer; and,
   within the housing for the transducer:
   converting said constant current to an excitation voltage or current using said constant current on said two-wire through a conversion circuit line;
   supplying said excitation voltage or current to a bridge sensor circuit, said bridge sensor circuit including at least one micro electro-mechanical systems (MEMS) sensing element;
   outputting, from said bridge sensor circuit and responsive to said excitation voltage or current, first and second bridge sensor output signals;
   generating through a conversion circuit a data signal combining said first and second bridge sensor output signals; and,
   outputting, on said two-wire line, said data signal.

2. The method of claim 1 wherein said data signal includes a DC component.

3. The method of claim 1 wherein said excitation voltage or current is thermally compensated.

4. A bridge sensor transducer for use with an internal electronic piezoelectric (IEPE) compatible two-wire circuit, comprising:
   a resistive bridge sensor circuit having a plurality of bridge sensor input/output (I/O) ports;
   a differential amplifier electrically connected to said resistive bridge sensor circuit, said differential amplifier configured to generate a differential amplifier output;
   a conversion circuit electrically connected at least one of said bridge sensor I/O ports and electrically connected to said differential amplifier, said conversion circuit configured to convert a constant current supply from an IEPE compatible two-wire current source to an excitation voltage or current for input into said resistive bridge sensor circuit, and said conversion circuit further configured to convert said differential amplifier output to a single-ended DC-coupled output; and two transducer I/O ports electrically connected to said conversion circuit, said transducer I/O ports configured and arranged for electrical connection to said IEPE compatible two-wire current source.

5. The bridge sensor transducer of claim 4 wherein said bridge sensor circuit, said differential amplifier and said conversion circuit are disposed within a single housing.

6. The bridge sensor transducer of claim 5 wherein said transducer I/O ports are accessible at the exterior of said housing.

7. The bridge sensor transducer of claim 4 wherein said bridge sensor circuit comprises a micro-electro-mechanical systems (MEMS) sensing element.

8. The bridge sensor transducer of claim 4 wherein said bridge sensor circuit comprises a plurality of strain gauges.

9. The bridge sensor transducer of claim 4 wherein said excitation voltage or current is thermally compensated.

10. The bridge sensor transducer of claim 4, further comprising a filter circuit electrically connected to said differential amplifier and electrically connected to said conversion circuit, said filter circuit configured and arranged to filter a signal from said differential amplifier.

* * * * *